United States Patent
Bergeret Sbarbaro et al.

(10) Patent No.: US 11,796,579 B2
(45) Date of Patent: Oct. 24, 2023

(54) SUPERCONDUCTING ELECTROMAGNETIC WAVE SENSOR

(71) Applicants: UNIVERSIDAD DEL PAÍS VASCO/EUSKAL HERRIKO UNIBERTSITATEA, Bizkaia (ES); AGENCIA ESTATAL CONSEJO SUPERIOR DE INVESTIGACIONES CIENTÍFICAS, Madrid (ES); UNIVERSITY OF JYVÄSKYLÄ, Jyväskylän (FI)

(72) Inventors: Fernando Sebastian Bergeret Sbarbaro, San Sebastían (ES); Francesco Giazotto, Pisa (IT); Tero Heikkilä, Jyväskylä (FI); Ilari Maasilta, Jyväskylä (FI)

(73) Assignees: UNIVERSIDAD DEL PAIS VASCO/EUSKAL HERRIKO UNIBERTSITATEA, Leioa (ES); AGENCIA ESTATAL CONSEJO SUPERIOR DE INVESTIGACIONES CIENTÍFICAS, Madrid (ES); UNIVERSITY OF JYVÄSKYLÄ, Jyväskylän (FI)

( * ) Notice: Subject to any disclaimer, the term of this patent is extended or adjusted under 35 U.S.C. 154(b) by 883 days.

(21) Appl. No.: 16/649,884

(22) PCT Filed: Sep. 25, 2018

(86) PCT No.: PCT/IB2018/057413
§ 371 (c)(1),
(2) Date: Mar. 23, 2020

(87) PCT Pub. No.: WO2019/058357
PCT Pub. Date: Mar. 28, 2019

(65) Prior Publication Data
US 2021/0165029 A1    Jun. 3, 2021

(30) Foreign Application Priority Data

Sep. 25, 2017   (IT) .................. 102017000107007

(51) Int. Cl.
*G01R 29/08*    (2006.01)
*G01J 5/20*     (2006.01)
(Continued)

(52) U.S. Cl.
CPC ........... *G01R 29/0878* (2013.01); *G01J 5/20* (2013.01); *H10N 60/10* (2023.02);
(Continued)

(58) Field of Classification Search
CPC .. G01R 29/0878; G01J 5/20; G01J 2005/208; H10N 60/10; H01F 1/0018
See application file for complete search history.

(56) References Cited

U.S. PATENT DOCUMENTS 5,090,819 A    2/1992   Kapitulnik
5,538,941 A *  7/1996   Findikoglu ............... H01P 7/00
                                                    505/700
(Continued)

FOREIGN PATENT DOCUMENTS

WO    2012/038596 A1    3/2012

OTHER PUBLICATIONS

Giazotto, F, et al., "Ferromagnetic-Insulator-Based Superconducting Junctions as Sensitive Electron Thermometers", Physical Review Applied, vol. 4, No. 4, 044016, 12 Pages (Oct. 26, 2015).
(Continued)

*Primary Examiner* — Dominic E Hawkins
(74) *Attorney, Agent, or Firm* — Maschoff Brennan

(57) ABSTRACT

An electromagnetic sensor for use in a variety of applications requiring extremely high sensitivity, such as measuring power and characteristics of incident electromagnetic radia-
(Continued)

tion includes a superconducting layer that carries an exchange field for providing a spin splitting effect of charge carriers in the superconducting layer, a metal electrode, and an insulating layer arranged between the superconducting layer and metal electrode to form a spin filter junction therebetween. The electromagnetic sensor provides an antenna including a wave collecting element, in contact with the superconducting layer to convey thereinto external electromagnetic waves that are generated by an external source. An electric measurement device provides an output signal responsive to the amplitude and frequency of the external electromagnetic waves, and contacts the metal electrode to measure an electric current or voltage caused by the spin splitted charge carrier flow from the superconducting layer through the spin filter junction into the metal electrode.

18 Claims, 3 Drawing Sheets

(51) Int. Cl.
*H10N 60/10* (2023.01)
*H01F 1/00* (2006.01)
*H01F 1/147* (2006.01)

(52) U.S. Cl.
CPC ....... *G01J 2005/208* (2013.01); *H01F 1/0018* (2013.01); *H01F 1/14708* (2013.01)

(56) References Cited

U.S. PATENT DOCUMENTS

| | | | |
|---|---|---|---|
| 5,880,468 A | 3/1999 | Irwin et al. | |
| 7,369,093 B2* | 5/2008 | Oppenlander | H01Q 1/364 |
| | | | 343/872 |
| 10,145,743 B2* | 12/2018 | Timofeev | H10N 15/00 |
| 2008/0067500 A1* | 3/2008 | Matsui | H10N 60/12 |
| | | | 257/E29.142 |
| 2014/0315723 A1* | 10/2014 | Moyerman | G01K 7/01 |
| | | | 505/190 |

OTHER PUBLICATIONS

Heikkila, T, et al., Thermoelectric radiation detector based on superconductor/ferromagnet systems, Physical Review Applied, vol. 10, 034053, 10 Pages (Sep. 29, 2017).

Ozaeta, A., et al., "Huge thermoelectric effects in ferromagnet-superconductor junctions in the presence of a spin-splitting field", Physical Review Applied, 112, 5 Pages, (Jul. 19, 2013).

Sergeev A.V., et al., "Ultrasensitive hot-electron kinetic-inductance detectors operating well below the superconducting transition", Physical Review Applied, vol. 80, Issue 5, pp. 817-819 (Feb. 4, 2002).

Strambini, et al., "Revealing the magnetic proximity effect in EuS/Al bilayers through superconducting tunneling spectroscopy",Physical Review Applied vol. 1, 9 Pages (May 22, 2017).

* cited by examiner

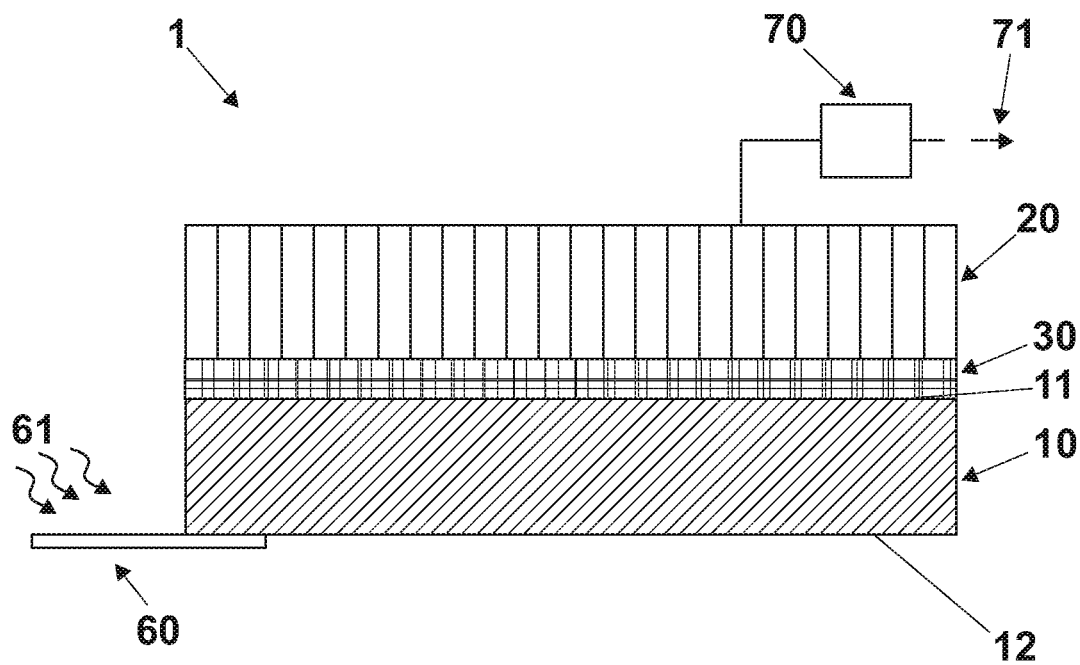
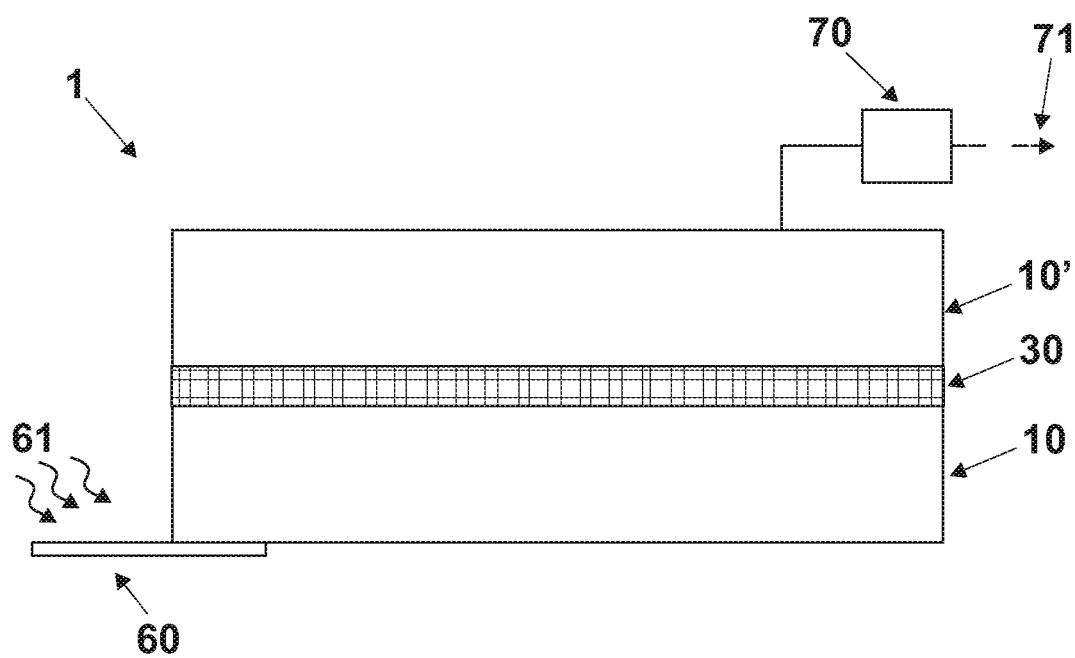

SUPERCONDUCTING ELECTROMAGNETIC WAVE SENSOR

FIELD OF THE INVENTION

The present invention relates to a sensor of electromagnetic radiation comprising superconducting layers that can be used in a wide variety of applications requiring extremely high sensitivity.

In particular, the invention relates to an electromagnetic sensor that can be used for measuring power and characteristics of incident electromagnetic radiation.

DESCRIPTION OF THE PRIOR ART

Accurate wide-band electromagnetic sensors are known that are based on superconducting heterostructures. Sensors of this kind, in particular Transition Edge Sensors also known as TES, are described for instance in U.S. Pat. Nos. 5,880,468 and 5,090,819, and can be used in applications requiring extremely high sensitivity, for example for detection of the cosmic microwave background, for generic-purpose terahertz radiation sensing, like security imaging, and in materials analysis via detection of x-rays scattered from target materials.

As shown in A. V. Sergeev, V. V. Mitin, and B. S. Karasik, *Appl. Phys. Lett.* 80, 817 (2002), a Kinetic Inductance Detector (KID) was proposed as an alternative to TES sensors.

However, both TES and KID sensors operating at sub Kelvin temperatures have the disadvantage of requiring a separate voltage bias line, which is a structural constraint especially in the case of an array of such sensors. Moreover, bias lines tend to heat up the system and introduce noise, which can be relevant in case of extremely high sensitivity measurements. Furthermore, they are based on the measurement of an impedance of the sensor as a result of a response to a probe signal.

Potential functionalities based on superconducting heterostructures not requiring probe signals have been described, exploiting the known thermoelectric effect, namely a direct conversion of temperature differences into an electric voltage and vice versa.

In A. Ozaeta, P. Virtanen, F. S. Bergeret, and T. T. Heikkilä, *Phys. Rev. Lett.* 112, 5 (2014), thermoelectric effects in a junction, between a conventional superconductor, in the presence of an exchange field and a ferromagnet with polarization, have been theoretically described. In particular, a structure comprising a ferromagnet coupled via a tunneling contact to a superconductor, whose density of states is modified by an exchange field, has been described.

In F. Giazotto, P. Solinas, A. Braggio, and F. S. Bergeret, *Phys. Rev. App. American Physical Society,* 4, 4 (2015) a thermometer based on superconducting tunnel junction has been disclosed. In particular, the authors analysed thermoelectric transport of charge carriers in a thermoelectric element based on a metal-ferromagnetic insulator-superconductor heterostructure, implemented as an ultra-sensitive thermometer. The thermoelectric element is included in a circuit formed by superconducting wires, a load element having a predetermined resistance, and a Josephson junction. Current in the circuit is responsive to the difference of temperature between the metal and the superconductor of the thermoelectric element.

In STRAMBINI E ET AL: "Revealing the magnetic proximity effect in EuS/Al bilayers through superconducting tunneling spectroscopy", arXiv: 1705.04795~2 [cond-mat. supr-con], 22 May 2017 (2017-05-22), XP055470963, and in GIAZOTTO F ET AL: "Ferromagnetic-Insulator-Based Superconducting Junctions as Sensitive Electron Thermometers", PHYSICAL REVIEW APPLIED, vol. 4, no. 4, 044016, 26 Oct. 2015 (2015-10-26), XP055479037, superconducting tunnel junctions are disclosed comprising a (superconducting) metal electrode, a superconducting layer arranged to carry an exchange field for providing a spin splitting effect of charge carriers (electrons (N, e.g. Al), and an insulating layer between the superconducting layer and the metal electrode, in such a way to form a spin filter junction using magnetic proximity effect by a ferromagnetic insulator as underlayer or as tunnel barrier layer, as thermometric sensors.

In WO2012/038596A1 a detector for quantum computing is disclosed that is able to detect single photons propagating in a collector as input and an electric measurement arrangement in the form of an RF reflection measurement circuit and amplifier as output coupled to a superconducting tunnel junction detector element.

SUMMARY OF THE INVENTION

It is a feature of the present invention to provide an electromagnetic sensor not requiring a probe signal or any extra bias power to be applied into the electromagnetic sensor.

It is a particular feature of the present invention to provide such an electromagnetic sensor that can provide the intensity of an incoming radiation.

It is another particular feature of the present invention to provide such an electromagnetic sensor that can provide also the frequency of an incoming radiation.

It is a feature of the present invention to provide an electromagnetic sensor that, during its operation, can achieve a high-energy efficiency versus dissipated heat and absorbed energy.

It is still a feature of the present invention to provide an electromagnetic sensor with good measurement properties under a wide range of operating temperatures.

It is still a feature of the present invention to provide an electromagnetic sensor having a large signal to noise ratio.

It is another feature of the present invention to provide such an electromagnetic sensor that can be arranged as an array of sensors providing a plurality of pixels, to achieve a broad detection bandwidth.

It is a particular feature of the present invention to provide such an electromagnetic sensor that can be arranged as an array of sensors providing a plurality of pixels, to achieve broad spatial and angular resolution.

These and other objects are achieved by an electromagnetic sensor comprising,
- a superconducting layer, arranged to carry an exchange field for providing a spin splitting effect of charge carriers in said superconducting layer,
- a metal electrode,
- an insulating layer arranged between said superconducting layer and said metal electrode, in such a way to form a spin filter junction between said superconducting layer and said metal electrode,
- an antenna comprising a wave collecting element, arranged in contact with said superconducting layer to convey into said superconducting layer electromagnetic waves collected by said antenna and generated by an external source, said electromagnetic waves having an amplitude and a frequency, an electric measurement device arranged in contact with said metal electrode and configured to measure an electric current or voltage caused by said spin splitted charge carrier flow from said superconducting layer through said spin filter junction into said metal electrode and to provide an output signal responsive to said amplitude and frequency of said external electromagnetic waves collected by said antenna.

This way, electromagnetic waves, conveyed by the wave-collecting element, are absorbed by the spin-split superconductor, thus creating a strong non-equilibrium state of spin-split quasiparticles, namely charge carriers, within the superconductor. This non-equilibrium state can relax in various ways, like via quasiparticle-quasiparticle collisions, via processes such as the quasiparticle-phonon relaxation, via escapes of quasiparticles back through the wave-collecting element, and via the escape of the quasiparticles to the metal electrode via the spin filter junction, the last process yielding the output signal sought by the present invention.

By means of the electric measurement device, arranged in contact with metal electrode to measure quasiparticles flow through the spin filter junction into the metal electrode, an output signal responsive to the amplitude of the external electromagnetic waves is obtained which can be measured for example with the use of a regular amplifier.

This way, the incoming electromagnetic waves determine the output signal, and no separate power source is needed except from the electric measurement device, which can be remote or sufficiently far from the superconducting layer, where radiation is absorbed. Moreover, the ratio between the intensity of the output signal and the incoming radiation is very high, and therefore the sensor can be used also for measurements that would require hypersensitivity, without oversizing the sensors.

With respect to the prior art radiation sensors like TES or KID, the present invention does not require extra power to be applied on the electromagnetic sensor, obtaining a reduced power consumption. Moreover, a separate voltage bias line is not required, reducing structural constraints, which would be very encumbering in the case of an array of such sensors. In addition, the absence of bias lines that would heat up the system and introduce noise, is very relevant, and permits making extremely high sensitivity measurements, owing to a very low signal to noise ratio.

The superconductor can be of any known superconducting metal. Preferably, the superconductor can be of a metal selected from the group consisting of: Al, V, Ti. In fact, these materials would have lower critical temperature, and therefore less noise, and lower magnitude of spin relaxation within the material in such a way to increase the sensor sensitivity.

In possible embodiments, the superconducting layer is arranged to carry an exchange field for providing the sought spin splitting effect via the proximity to a ferromagnetic material. Alternatively, the superconducting layer is arranged to carry an exchange field for providing the sought spin splitting effect by an externally applied magnetic field.

In a possible embodiment, the superconducting layer of the electromagnetic sensor is in contact with the insulating layer on a first face, and a ferromagnetic insulating layer is provided arranged in contact with the superconducting layer on the second face opposite to the first face, said ferromagnetic insulating layer arranged to provide the spin splitting field.

This way, the ferromagnetic insulating layer in contact with the superconducting layer determines in a simple way a magnetic proximity effect on the superconducting layer resulting into a spin-splitting exchange field h inside the superconducting layer.

In a further possible embodiment, the insulating layer is a ferromagnetic insulating layer and said superconducting layer is in contact with the insulating layer on the first face, the ferromagnetic insulating layer arranged to provide the spin splitting exchange field.

This way, the ferromagnetic insulating layer in contact with the superconducting layer has a double function of supplying the exchange field for the spin splitting of the charge carriers, owing to its ferromagnetic nature, and of providing a tunneling spin filter function, owing to its spin-dependent insulating properties. This double function enhances the possibility of achieving high density of integration.

Advantageously, the ferromagnetic insulating layer can be an insulator selected from the group consisting of: EuS, EuO, GdN. The use of these materials allows generating effects of magnetic proximity in a particularly efficient way.

In an alternative embodiment, an external magnetic field parallel to the superconducting layer provides the spin-split status in the superconducting layer. This situation would not require the ferromagnetic insulating layer to be achieved. In a possible arrangement, the external magnetic field is provided by a coil oriented right to the superconducting layer in such a way to provide a magnetic field parallel to the superconducting layer. In this case, the contact between the superconducting layer and the electrode still needs to be a spin filter contact. This functionality can be obtained by either using a ferromagnetic insulating layer for this contact, or using a non-magnetic insulating layer and a ferromagnetic electrode.

In possible alternative embodiments, the metal electrode is selected from the group consisting of: a paramagnetic metal, a ferromagnetic metal, a superconducting metal.

In case the metal electrode is a paramagnetic metal, it can be selected from the group consisting of: Cu, Ag, Au, Pt.

In case the metal electrode is a superconductor, it can be of be any known superconducting metal. Preferably, the superconducting metal electrode is selected from the group consisting of: Al, V, Sn, Nb, Pb, In, Ta, La, Hg, Ti, Cd, Zn, Mo, Ga, Re, Pd.

In case the metal electrode is a ferromagnetic metal, it can be selected from the group consisting of: Fe, Co, Ni.

In a possible embodiment, in particular where metal electrode is a ferromagnetic metal, the insulating layer is made of an aluminum oxide, preferably $Al_2O_3$. This material for the insulating layer can be very thin, even a few atomic layers, without losing the insulating properties between said superconducting layer and said metal electrode, and the capability of forming together with the ferromagnetic metal a spin filter tunneling junction.

In a possible embodiment, said antenna is a superconductive antenna that is in contact with said superconducting layer.

In particular, to prevent heat leaking out from the superconducting layer, the wave-collecting element is manufactured from a material with a superconducting gap $\Delta$ higher than the gap of the material selected for the superconducting layer $\Delta$. For example, the wave-collecting element can be an Nb antenna and said superconducting layer can be made of Al.

Advantageously, the superconducting layer has a normal state resistance, as it can be seen by the radiation at frequencies higher than $\Delta/h$—where h is Planck's constant—that is matched to the specific impedance of the antenna, typically somewhat below the vacuum impedance.

In a possible embodiment, said wave collecting elements can also be an absorber, in particular a thicker film of a material with higher atomic number than said superconducting layer and in contact with said superconducting layer, in order to be capable of absorbing high frequency electromagnetic radiation.

In a possible embodiment of the invention, the electric measurement device comprises an amplifier. In particular, said amplifier can be a current or voltage amplifier, such as a superconducting quantum interference device (SQUID) amplifier or field effect transistor, such as a high electron mobility transistor (HEMT).

In a possible alternative embodiment, the electromagnetic sensing apparatus comprises an array of electromagnetic sensors in any of the embodiments above defined. This way, the array of sensors, would have a broader detection bandwidth and spatial/angular resolution than a single sensor. Moreover, thanks to the absence of bias lines, a detector of electromagnetic radiation with high integration density can be attained.

BRIEF DESCRIPTION OF THE DRAWINGS

Further characteristics and/or advantages of the present invention will be made clearer with the following description of an exemplary embodiment thereof, exemplifying but not limitative, with reference to the attached drawings in which:

FIG. 3 diagrammatically shows a third exemplary embodiment of a single electromagnetic sensor, according to the present invention, starting from the element of FIG. 1, with a ferromagnetic insulating layer configured as insulating layer;

FIG. 4 diagrammatically shows a fourth exemplary embodiment of a single electromagnetic sensor, according to the present invention, comprising two superconducting layers separated by a ferromagnetic insulating layer;

DESCRIPTION OF SOME PREFERRED EXEMPLARY EMBODIMENTS

Figure 1:
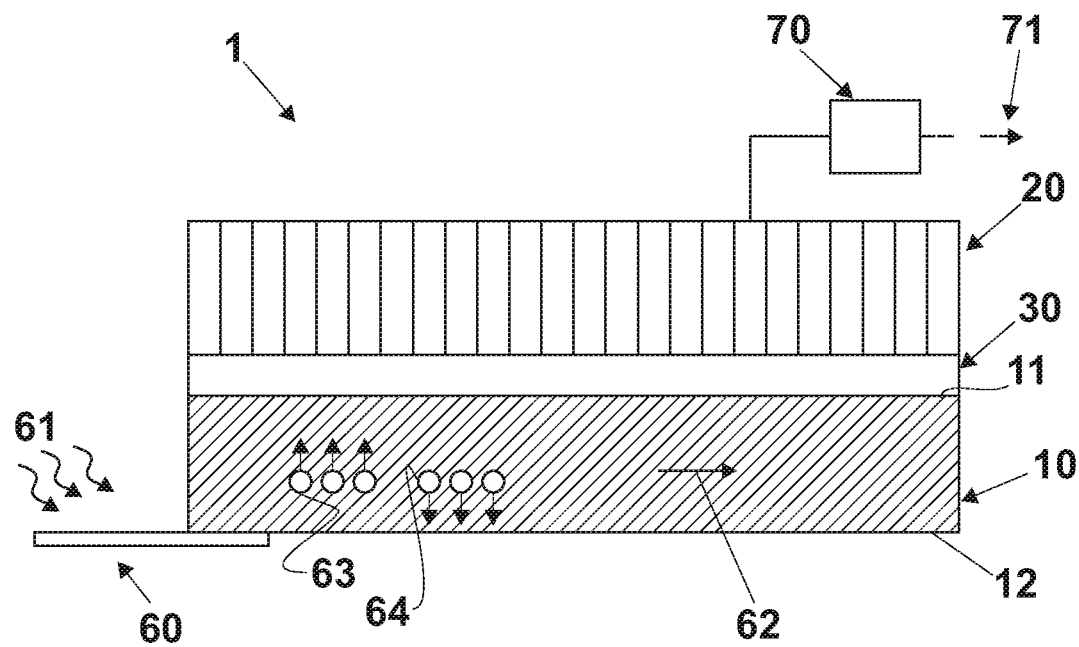
FIG. 1 diagrammatically shows a first exemplary embodiment of a single electromagnetic sensor, according to the present invention.

With reference to FIG. 1, in a first possible embodiment, an electromagnetic sensor 1 comprises a spin filter junction consisting of an insulating layer 30, in particular a ferromagnetic insulator 30 arranged between a superconducting layer 10 and a metal electrode 20, or an insulator 30 arranged between a superconducting layer 10 and a ferromagnetic metal electrode 20. Insulating layer 30 can be very thin, sufficiently to form the spin filter junction between superconducting layer 10 and metal electrode 20.

A wave collecting element 60 is arranged in contact with superconducting layer 10 to convey into superconducting layer 10 external electromagnetic waves 61 generated by an external source. In particular, the electromagnetic waves 61 have an amplitude and a frequency.

Superconducting layer 10 comprises a face 11 or 12 arranged to be exposed to a magnetic field (not shown) in order to provide, by either Zeeman effect or magnetic proximity, a spin splitting effect 63, 64 of charge carriers in superconducting layer 10. The magnetic field 62 can be parallel to any of faces 11 or 12. The spin splitting 63, 64 has been symbolically depicted as charge carriers in the body of superconducting layer 10, like spin-up 63 and spin-down 64 electrons.

In particular, as above described, electromagnetic waves 61, conveyed by wave collecting element 60, are absorbed by the spin-split superconductor 10 where a strong nonequilibrium state of spin-split quasiparticles is created, which can relax in various ways, like via quasiparticle-quasiparticle collisions, via spurious processes such as the quasiparticle-phonon relaxation, via escapes of quasiparticles back through the wave collecting element, and via the escape of the quasiparticles to the metal electrode 20 via the spin filter junction, which is the sought effect. The last process yields to the output signal 71 detected by an electric measurement device 70, arranged in contact with the metal electrode 20. Electric measurement device 70 is arranged to measure quasiparticle flow through the spin filter junction into the metal electrode 20 and by providing an output signal 71 responsive to the amplitude of the external electromagnetic waves 61. Electric measurement device 70 can also preferably be arranged to provide the frequency of the incoming external electromagnetic waves 61.

Also, the quasiparticle-quasiparticle collisions relax the initially non-thermal nonequilibrium energy distribution into a thermal one, but with an increased temperature.

Superconducting layer 10 can be for example Al, V, Ti, in order to obtain, by magnetic proximity or by an external magnetic field, the desired spin splitting effect 63,64 on the charge carriers present in superconducting layer 10.

Advantageously, the wave collecting element 60 is an antenna. In particular, it can be a superconductive antenna 60 in good contact with superconducting layer 10.

Measurement device 70 can comprise an amplifier. In particular, the amplifier can be a current or voltage amplifier, such as a superconducting quantum interference device (SQUID) amplifier or field effect transistor, such as a high electron mobility transistor (HEMT).

To prevent heat leaking out from the superconducting layer 10, the superconductor used in the antenna 60 should be manufactured from a material with a higher superconducting gap $\Delta_A$ than gap $\Delta$ of the material selected for the superconducting layer 10.

One possible combination could be an Nb antenna 60 and an Al absorber 10. For optimal quantum efficiency, the normal state resistance of the absorber (seen by the radiation at frequencies higher than $\Delta/h$, where h is Planck's constant) should be matched to the specific impedance of the antenna, typically somewhat below the vacuum impedance. For example, considering an Al film thickness of 10 nm of superconducting layer 10, it would have a typical sheet resistance is 5-10 $\Omega$m. Hence, for wave collecting element 60 a 1 μm wide film with length L=10 μm would have the resistance $R\gamma$=50-100$\Omega$ seen by the radiation, thereby matching well with typical microwave antennas.

Figure 2:
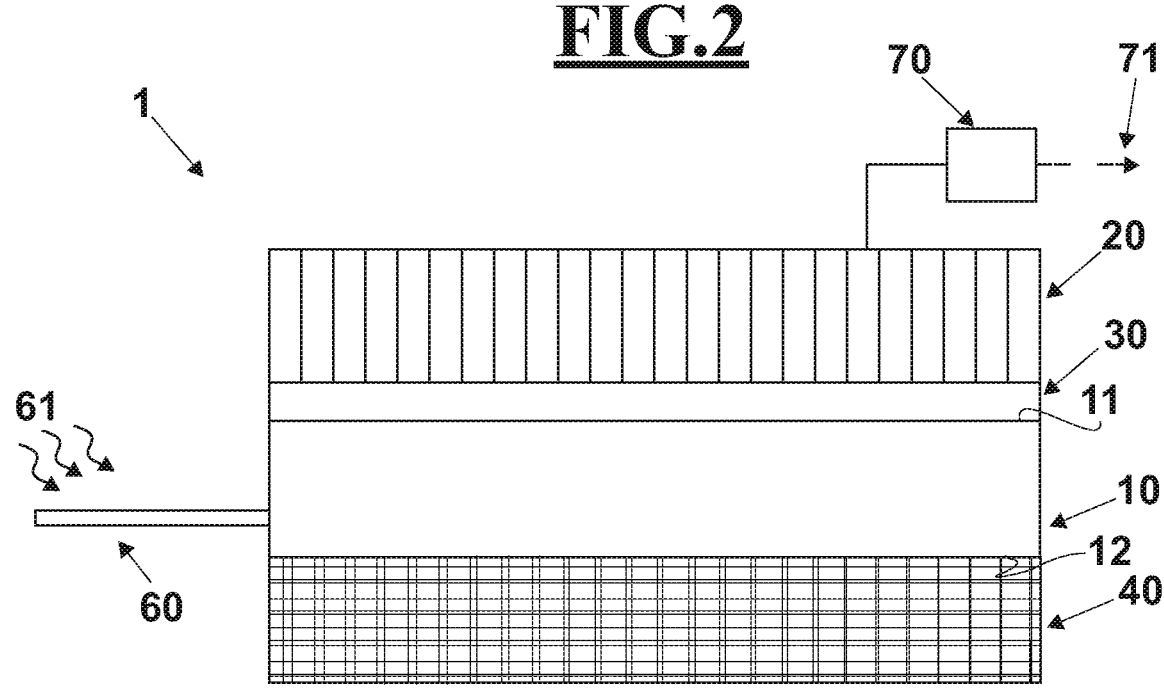
FIG. 2 diagrammatically shows a second exemplary embodiment of a single electromagnetic sensor, starting from the sensor of FIG. 1, with the addition of a ferromagnetic insulating layer according to the present invention on a second face of the superconducting layer.

With reference to FIG. 2, in a second possible embodiment, similarly to FIG. 1, an electromagnetic sensor 1 comprises a spin filter junction consisting of an insulating layer 30 arranged between a superconducting layer 10 and a metal electrode 20, in particular a ferromagnetic insulator 30 arranged between a superconducting layer 10 and a metal electrode 20, or an insulator 30 arranged between a superconducting layer 10 and a ferromagnetic metal electrode 20, and is configured to permit passage of current of quasiparticles. Superconducting layer 10 is in contact with the insulating layer 30 on first face 11.

Differently from FIG. 1, a ferromagnetic insulating layer 40 is provided arranged in contact with superconducting layer 10 on a second face 12 opposite to first face 11. The ferromagnetic layer 40 is arranged to provide the magnetic field. In particular, ferromagnetic insulating layer 40 in contact with the superconducting layer 10 provides, by magnetic proximity effect a spin-splitting exchange field in superconducting layer 10.

In this embodiment the insulating layer 30 can be made of an aluminum oxide, for example Al$_2$O$_3$, which can be very thin, even a few atomic layers, without losing the insulating properties between said superconducting layer and electrode 20, and the capability of forming a spin filter junction. In this embodiment, it is particularly advantageous that the electrode 20 is a ferromagnetic electrode, for example selected among Ni, Co, Fe, for achieving maximum spin filter efficiency.

Concerning the generation of the electric signal and its measurement, the embodiment of FIG. 2 operates in the same way as described for the embodiment of FIG. 1.

With reference to FIG. 3, in a third possible embodiment, similarly to FIG. 1, an electromagnetic sensor 1 comprises a spin filter junction consisting of an insulating layer 30 arranged between a superconducting layer 10 and a metal electrode 20 and is configured to permit passage of current of quasiparticles. Superconducting layer 10 is in contact with the insulating layer 30 on first face 11.

As a particular embodiment derived from the general embodiment FIG. 1, the insulating layer 30 is a ferromagnetic insulating layer and superconducting layer 10 is in contact with the insulating layer 30 on a first face 11. The ferromagnetic insulating layer 30 in contact with the superconducting layer 10 has a double function of supplying the magnetic field for the spin splitting of the charge carriers resulting from the electromagnetic waves 61, owing to its ferromagnetic nature and, owing to its insulating properties, of providing spin filter junction, which carries out tunneling spin filter function. This double function enhances the possibility of achieving high density of integration.

In this embodiment, the ferromagnetic insulating layer 30 can be EuS, EuO, GdN, which are ferromagnetic insulators capable of providing both functions. In particular, the metal electrode 20 can be a metal like Cu, Ag, Au, Pt.

It is also possible that also the metal electrode 20 is a ferromagnetic metal like ferromagnetic electrode Ni, Co, Fe.

Concerning the generation of the electric signal and its measurement, the embodiment of FIG. 3 operates in the same way as described for the embodiment of FIG. 1.

With reference to FIG. 4, in a fourth possible embodiment the insulating layer 30 is a ferromagnetic insulating layer, and the spin filter junction is obtained by ferromagnetic insulating layer arranged between first superconducting layer 10 and a second superconducting layer 10' as metal electrode.

The advantage of having a superconducting metal electrode is in the possibility of obtaining a larger thermoelectric effect, and in the absence of any spurious dissipation of the read-out signal.

Concerning the generation of the electric signal and its measurement, the embodiment of FIG. 4 operates in the same way as described for the embodiments of FIGS. 1 and 3.

Figure 5:
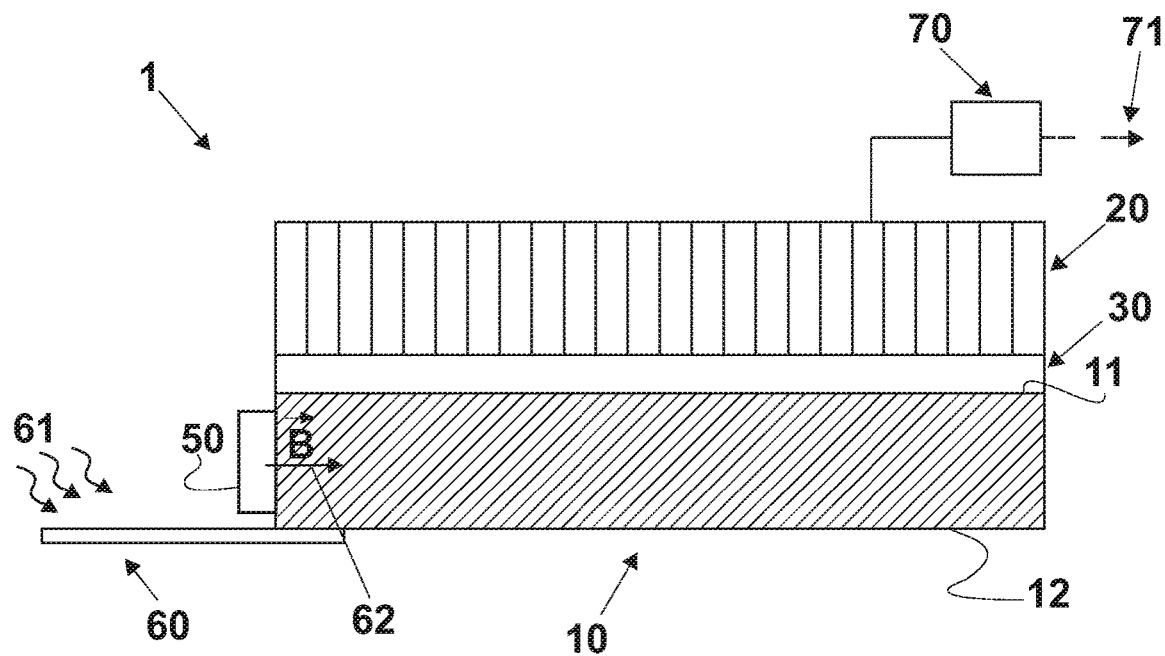
FIG. 5 diagrammatically shows a fifth exemplary embodiment of a single electromagnetic sensor, according to the present invention, where the magnetic field is provided by an external magnetic element.

With reference to FIG. 5, in a fifth possible embodiment an electromagnetic sensor 1 comprises a spin filter junction consisting of an insulating layer 30 arranged between a superconducting layer 10 and a metal electrode 20, in particular a ferromagnetic metal electrode, for example selected among Ni, Co, Fe, for achieving maximum spin filter efficiency. Differently from FIGS. 1-4 an external magnetic element 50 can be arranged to provide the magnetic field, like a metal coil or a large permanent magnet.

Superconducting layer 10 is exposed to a magnetic field in order to provide, by Zeeman effect, a spin splitting effect of charge carriers in superconducting layer 10.

Figure 6:
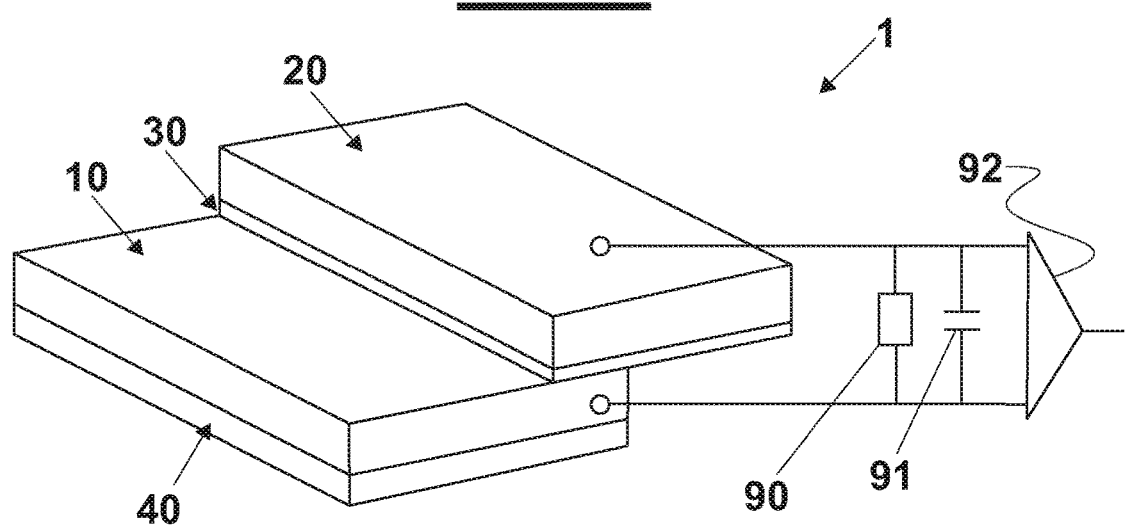
FIG. 6 diagrammatically shows a perspective schematic view of an electromagnetic sensor according to the invention with a possible embodiment of an electric measurement device.

With reference to FIG. 6, a perspective view of an electromagnetic sensor 1, similar to the embodiment of FIG. 2, is shown. In particular, the current injected to the metal electrode 20 is detected via an electric measurement device 70 comprising an amplifier 92. Also a capacitor 91 and/or an inductor 90 can be provided, in particular in case of multi-pixel readout systems, for example in case multiple sensor are arranged as an array and multiplexing or multi-pixel readout is needed.

In this connection, in a way not shown but that can be implemented by a person skilled in the art of manufacturing integrated circuits, an array of electromagnetic sensors can be provided without finding structural constraints like the prior art.

The foregoing description of some exemplary specific embodiments can show the invention from a conceptual viewpoint so that other, by applying current knowledge, will be able to modify and/or adapt in various applications the specific exemplary embodiments without further research and without parting from the invention, and, accordingly, it is meant that such adaptations and modifications will have to be considered as equivalent to the specific embodiments. The means and the materials to perform the different functions described herein could have a different nature without, for this reason, departing from the field of the invention. It is to be understood that the phraseology or terminology that is employed herein is for the purpose of description and not of limitation.

The invention claimed is:

1. An electromagnetic sensor comprising:
    a superconducting layer arranged to carry an exchange field for providing a spin splitting effect of charge carriers in said superconducting layer;
    a metal electrode;
    an insulating layer arranged between said superconducting layer and said metal electrode, in such a way to form a spin filter junction between said superconducting layer and said metal electrode;
    an antenna comprising a wave collecting element arranged in contact with said superconducting layer to convey into said superconducting layer external electromagnetic waves collected by said antenna and generated by an external source, said electromagnetic waves having an amplitude and a frequency; and
    an electric measurement device, arranged in contact with said metal electrode and configured to measure an electric current or voltage caused by said spin splitted charge carrier flow from said superconducting layer through said spin filter junction into said metal electrode and to provide an output signal responsive to said amplitude and frequency of said external electromagnetic waves collected by said antenna.

2. The electromagnetic sensor according to claim 1, wherein:
   said superconducting layer is in contact with said insulating layer on a first face, and
   a ferromagnetic insulating layer is provided arranged in contact with said superconducting layer on a second face opposite to said first face, said ferromagnetic insulating layer being arranged to provide said exchange field and being selected from the group consisting of: EuS, EuO, and GdN.

3. The electromagnetic sensor according to claim 1, wherein;
   said insulating layer is a ferromagnetic insulating layer; and
   said superconducting layer is in contact with said insulating layer on a first face, said ferromagnetic insulating layer being arranged to provide said exchange field.

4. The electromagnetic sensor according to claim 1, wherein an external magnetic element is arranged to provide said exchange field via a magnetic field Zeeman effect.

5. The electromagnetic sensor, according to claim 1, wherein said superconducting layer (10) is of a metal selected from the group consisting of: Al, V, and Ti.

6. The electromagnetic sensor according to claim 1, wherein:
   said metal electrode is selected from the group consisting of: a paramagnetic metal, a ferromagnetic metal, a superconducting metal, wherein:
       said paramagnetic metal is selected from the group consisting of: Cu, Ag, Au, and Pt;
       said ferromagnetic metal is selected from the group consisting of: Fe, Co, and Ni; and
       said superconducting metal is selected from the group consisting of: Al, V, Sn, Nb, Pb, In, Ta, La, Hg, Ti, Cd, Zn, Mo, Ga, Re, and Pd.

7. The electromagnetic sensor according to claim 1, wherein said antenna is a superconductive antenna that is in contact with said superconducting layer.

8. The electromagnetic sensor according to claim 1, wherein said wave collecting element is manufactured from a material with a superconducting gap higher than the gap of the material selected for the superconducting layer (10).

9. The electromagnetic sensor according to claim 1, wherein said electric measurement device comprises an amplifier.

10. An electromagnetic sensor array comprising an array of electromagnetic sensors according to claim 1.

11. An electromagnetic sensor array comprising an array of electromagnetic sensors according to claim 2.

12. An electromagnetic sensor array comprising an array of electromagnetic sensors according to claim 3.

13. An electromagnetic sensor array comprising an array of electromagnetic sensors according to claim 4.

14. An electromagnetic sensor array comprising an array of electromagnetic sensors according to claim 5.

15. An electromagnetic sensor array comprising an array of electromagnetic sensors according to claim 6.

16. An electromagnetic sensor array comprising an array of electromagnetic sensors according to claim 7.

17. An electromagnetic sensor array comprising an array of electromagnetic sensors according to claim 8.

18. An electromagnetic sensor array comprising an array of electromagnetic sensors according to claim 9.

* * * * *